United States Patent [19]
Hara

[11] Patent Number: 5,140,256
[45] Date of Patent: Aug. 18, 1992

[54] PWM SIGNAL DEMODULATION METHOD AND APPARATUS

[76] Inventor: Kojiro Hara, 5-13-15, Haruecho, Edogawa-ku, Tokyo, 134, Japan

[21] Appl. No.: 639,903

[22] Filed: Jan. 10, 1991

[30] Foreign Application Priority Data

Jan. 10, 1990 [JP] Japan ................................. 2-2747

[51] Int. Cl.⁵ .............................................. H03K 9/08
[52] U.S. Cl. .................................. 324/77 R; 324/617; 329/312; 341/53; 377/20
[58] Field of Search .............................. 341/53; 375/22; 329/312; 358/337, 339; 360/36.1, 36.2; 324/77 R, 617; 377/20

[56] References Cited

U.S. PATENT DOCUMENTS 3,179,882  4/1965  Clear ................................. 329/312
4,408,166 10/1983  Moeller ............................. 329/312

FOREIGN PATENT DOCUMENTS 0091215 10/1983 European Pat. Off. .............. 341/53

Primary Examiner—Kenneth A. Wieder
Assistant Examiner—Jose M. Solis
Attorney, Agent, or Firm—Knobbe, Martens, Olson & Bear

[57] ABSTRACT

A PWM signal demodulation method measuring the leading edge period of a modulated signal and a time between adjoining leading and trailing edges of the signal and finding the modulation factor in terms of the ratio of the period to the time. Reliable demodulation is ensured even if the carrier frequency of the modulated signal varies significantly. This novel method eliminates one disadvantage of the prior art demodulation method encountered when a varying carrier frequency exceeds the linearity domain of an integrator in its integrating characteristic, causing unreliable demodulation.

4 Claims, 2 Drawing Sheets

PWM SIGNAL DEMODULATION METHOD AND APPARATUS

BACKGROUND OF THE INVENTION

1. Field of the Invention

The present invention relates to a PWM (pulse width modulation) signal demodulation method and, more particularly, to a method for obtaining the modulation factor of a signal modulated by a PWM circuit and demodulating the modulated signal based on the modulation factor obtained.

2. Description of the Prior Art

With signals modulated by a PWM circuit, their trailing edges in waveforms vary while their leading edges remain fixed. To demodulate any of such modulated signals (PWM signals) has conventionally required using an integrator to find the modulation factor thereof on which the demodulation process is based.

One disadvantage of the prior art demodulation method that uses the integrator is that when the carrier frequency (leading edge period in waveform) of the modulated signal varies, the level of the signal demodulated by the method also varies.

Another disadvantage of the prior art demodulation method is that if the varying width of the carrier frequency is significantly large, the width may exceed the linearity domain of the integrating characteristic of the integrator in use. This means that the integrator tends to lag behind in its integrating operation during the demodulation process.

SUMMARY OF THE INVENTION

It is therefore an object of the present invention to overcome the above-described drawbacks and disadvantages and to provide a PWM signal demodulation method by which to eliminate level fluctuations of a demodulated signal if the carrier frequency of the incoming modulated signal varies.

It is another object of the present invention to provide a PWM demodulation method for reliably obtaining a demodulated signal if the carrier frequency of the incoming modulated signal varies.

In achieving the foregoing and other objects of the present invention and according to a first aspect thereof, there is provided a PWM signal demodulation method comprising measuring a leading edge period T of the modulated signal and a time "t" between adjoining leading and trailing edge thereof and inserting the results into the expression $$|(t-T/2) \div T/4|$$

in order to find a modulation factor.

According to a second aspect of the invention, there is provided a PWM signal demodulation method comprising measuring a leading edge period T of the modulated signal and a time "t" between adjoining leading and trailing edges thereof and inserting the results into the expression $$(t-T/4) \div T/2$$

in order to find a modulation factor.

DESCRIPTION OF THE PREFERRED EMBODIMENT

Figure 1:
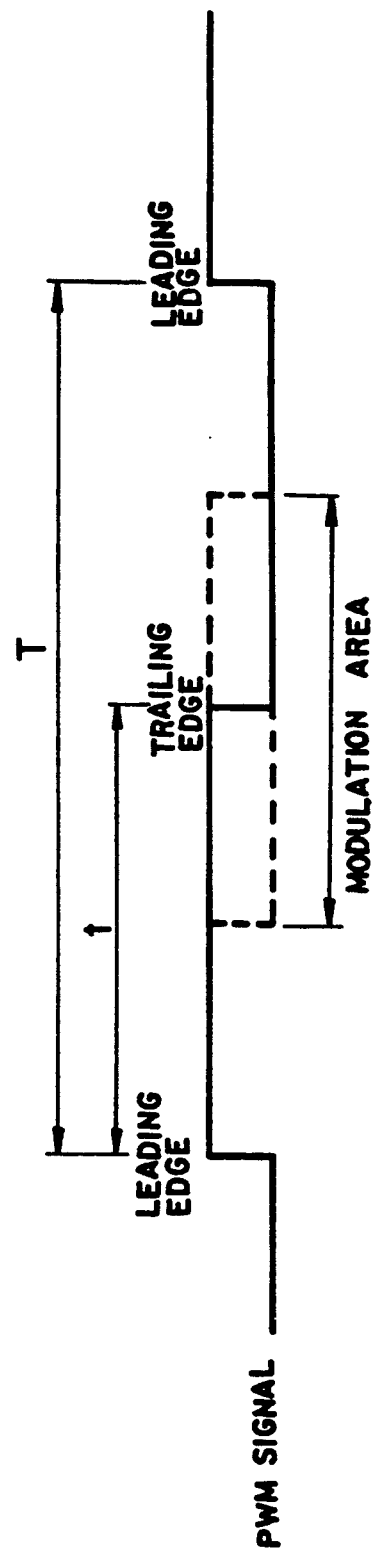
FIG. 1 is a signal waveform chart for illustratively describing how the present invention works.

How the invention works will now be described with reference to the waveform chart of FIG. 1. FIG. 1 shows a typical waveform of a PWM signal (simply called the modulated signal). It is assumed that T stands for the period between a first and a second leading edge of the modulated signal and "t" for the time between the first leading edge and the first trailing edge. The domain of the trailing edge part of the period T is called a modulation area.

In the first aspect of the invention, the modulation factor is 0% when $t=T/2$ and 100% when $t=T/4$ or $\frac{3}{4}T$. The intervening modulation factor is calculated based on the current time "t". The arithmetic expression used to calculate the modulation factor is $$modulation\ factor = |(t-T/2) \div T/4| \qquad (1)$$

The first aspect of the invention, when implemented, is sufficient to achieve the major object thereof. However, according to expression (1) above, the value $(t-T/2)$ becomes negative if the leading edge position of the modulated signal falls short of T/2. In that case, the circuitry for implementing the invention will become complicated.

Thus in the second aspect of the invention, the modulation factor is 0% when $t=T/4$ and 100% when $T=\frac{3}{4}T$. It follows that the modulation factor is 50% when $t=T/2$. This is how the following arithmetic expression is provided:

$$modulation\ factor = (t-T/4) \div T/2 \qquad (2)$$

According to expression (i) above, any case of modulation does not make the value $(t-T/4)$ negative. This is conducive to simplifying the circuit construction.

Figure 2:
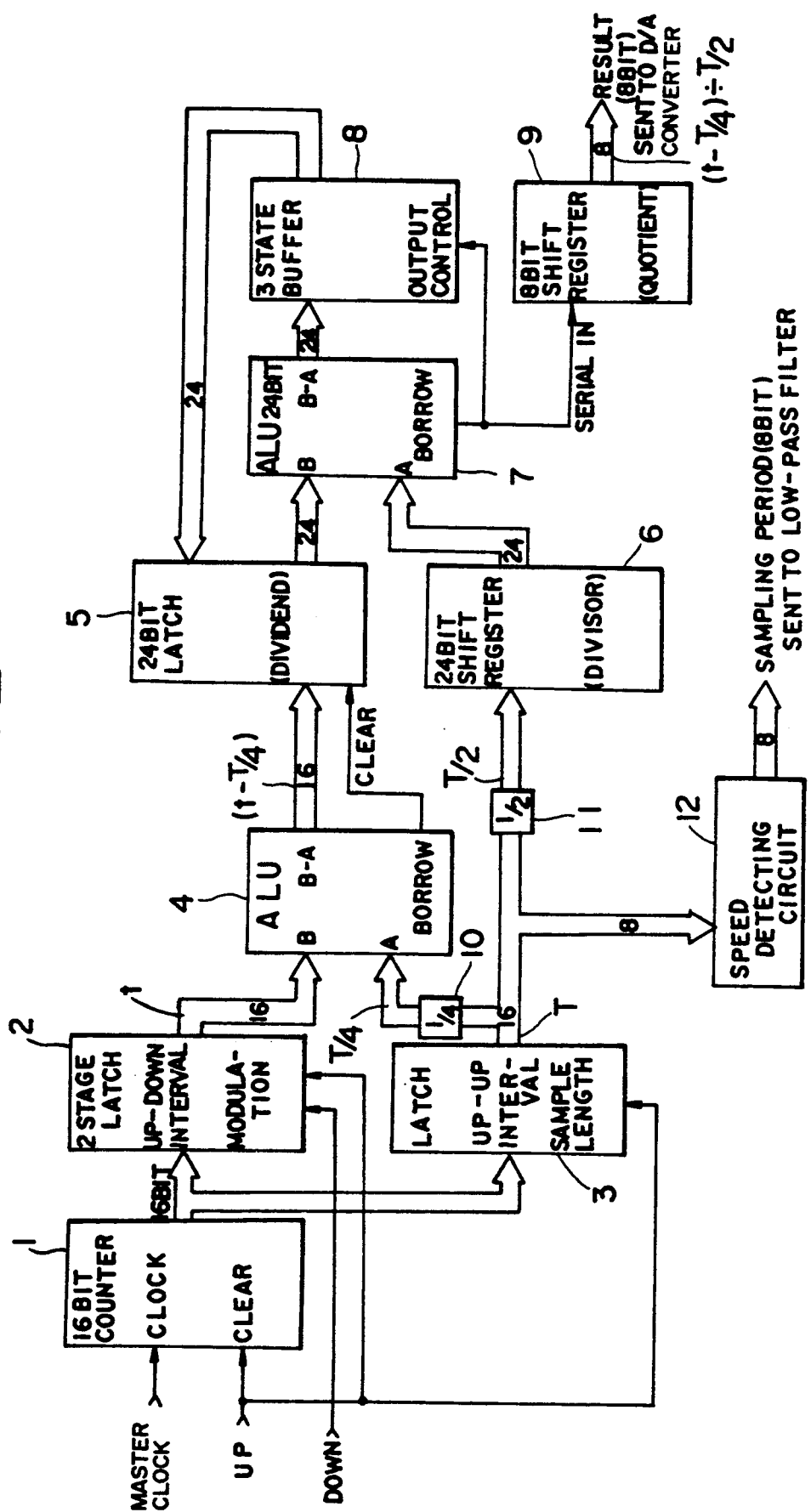
FIG. 2 is a block diagram of one embodiment of the invention.

FIG. 2 is a block diagram of the invention embodied to implement the second aspect thereof in accordance with arithmetic expression (2). How the embodiment is constructed will now be described in detail.

In FIG. 2, a 16-bit counter 1 has the clock and clear terminals thereof admit a master clock signal and a leading edge (UP) signal, respectively. A two-stage latch circuit 2 receives a leading edge (UP) and a trailing edge (DOWN) of the modulated signal in the 16-bit output from the counter 1. A latch circuit 3 receives the 16-bit output from the counter 1 and admits the leading edge (UP) of the modulated signal. A first ALU (algorithm unit) 4 receives at the terminal B thereof the 16-bit output from the two-stage latch circuit 2 and admits at the terminal A thereof the 16-bit output from the latch circuit 3 via a ¼ divider 10 to carry out subtraction B−A. A 24-bit latch circuit 5 admits the 16-bit output from the first ALU 4 and is cleared by a borrow output therefrom. A 24-bit shift register 6 admits the 16-bit output from the latch circuit 3 via a ½ divider 11. A second ALU (algorithm unit) 7 receives at the terminal B thereof the 24-bit output from the latch circuit 5 and admits at the terminal A thereof the 24-bit output from the shift register 6 to carry out subtraction B−A. A three-state buffer circuit 8 admits the 24-bit output from the second ALU 7, shifts the output until a borrow signal comes therefrom, and feeds the result back to the latch circuit 5. An eight-bit shift register 9 serially admits the borrow signal from the second ALU 7 and shifts the signal successively.

In FIG. 2, reference numeral 12 is a speed detecting circuit. When used in the demodulating circuit of a tape recorder, the speed detecting circuit 12 detects the speed of the tape running at high speed (fast forward or rewind) during demodulation, and causes an externally provided low-pass filter or the like accordingly to generate signals for removing noises resulting from the high-speed tape run.

The embodiment of the above construction works as follows. The counter 1 starts counting at a leading edge of the modulated signal. The count value is input to the two-stage latch circuit 2. The input to the circuit 2 continues until a trailing edge of the modulated signal arrives. At the trailing edge, the two-stage latch circuit 2 measures the time "t" between leading edge and trailing edge and outputs the time measurement. The latch circuit 3 measures the period T between one leading edge of the modulated signal and the next thereof, and outputs a signal representing the measured period. The first ¼ divider 10 outputs a T/4 signal. The first ALU 4 subtracts each output so that the value $(t-T/4)$ is obtained. This value is latched as a dividend by the latch circuit 5. An output signal T/2, which is a half of the output signal from the latch circuit 3, comes via the second divider 11 and enters the shift register 6. This input value is a divisor. A division takes place between second ALU 7 and three-stage buffer circuit 8. The shift register 9 outputs a signal representing the result of the division $$(t-T/4) \div T/2$$

the signal being demodulated by an external D/A converter.

The above-described embodiment is not intended to be limitative of the present invention. Many changes and variations may be made without departing from the spirit or scope of the invention.

For example, in addition to the circuit example embodying the second aspect of the invention as described above, the first aspect thereof may be implemented by replacing the divider 10 with a divider that outputs a T/2 signal and likewise the divider 11 with another divider that outputs the T/2 signal.

As described, the PWM signal demodulation method according to the invention comprises measuring the leading edge period of the modulated signal and the time between adjoining leading and trailing edges thereof and finding the ratio of the period to the time, thereby finding the modulation factor. One benefit of this method is that the modulation factor is obtained reliably if the carrier frequency varies or if the varying width thereof is significantly large. Thus the method is particularly suitable for applications such as tape recorders in which the carrier frequency varies appreciably.

Because all calculations in the first and second aspects of the invention are carried out digitally, there is no possibility of committing arithmetic errors. This feature enhances reliability.

Another benefit of this method is that the second aspect of the invention, when implemented, reduces circuit complexity.

It is to be understood that while the invention has been described in conjunction with a specific embodiment, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A pulse width modulation (PWM) signal demodulation method comprising the following steps of:
    (a) measuring a modulation time interval t between a leading edge and a trailing edge of said PWM signal with a digital value, said trailing edge follows immediately after said leading edge;
    (b) measuring a fixed time period T between a first leading edge and a second leading edge of said PWM signal with a digital value, said second edge follows immediately after said first leading edge;
    (c) dividing said fixed time period T into two and four to obtain a first divided period T/2 and a second divided period T/4, respectively, with digital value;
    (d) subtracting said second time period T/4 from said modulation time interval t so as to obtain a digital value of $t-T/4$;
    (e) dividing said digital value $t-T/4$ obtained in step (d) by said first divided period T/2 so as to obtain a digital value of $(t-T/4)2/T$; and
    (g) calculating a degree of modulation from the digital value obtained in step (e).

2. A PWM signal demodulation apparatus comprising;
    a first detecting circuit for detecting a modulation interval t between a leading edge and a trailing edge of said PWM signal in digital form, said trailing edge follows immediately after said leading edge;
    a second detecting circuit for detecting a fixed time period T between a first leading edge and a second leading edge of said PWM signal in digital form, said second leading edge follows immediately after said first leading edge
    a divider circuit for dividing said fixed time period T into two and four to obtain a first divided period T/2 and a second divided period T/4, respectively;
    a digital subtracting circuit for subtracting said second time period T/4 from said modulation time interval t so as to output a digital value of $t-T/4$;
    an arithmetic circuit for dividing said digital value $t-T/4$ from said subtracting circuit by said first divided period T/2 from said divider circuit so as to output a digital value of $(t-T/4)2/T$; and
    a digital to analog converter for generating an analog voltage indicating a degree of modulation of said PWM signal from the digital value obtained by said arithmetic circuit.

3. A PWM signal demodulation apparatus as defined in claim 2, wherein said first and second detecting circuits include a counter for counting a clock signal during time intervals defined by said PWM signal and a latch for temporally storing the counted results from said counter.

4. A PWM signal demodulation apparatus as defined in claim 2, wherein, said arithmetic circuit is comprised of an arithmetic unit for subtracting one data from the other data, a register for temporally storing data and providing said data to said arithmetic unit, and a buffer for feedbacking resulted data from said arithmetic unit to said register.

* * * * *